(12) United States Patent
Tamura (10) Patent No.: US 11,340,263 B2
(45) Date of Patent: May 24, 2022

(54) PROBE DEVICE AND METHOD OF ADJUSTING THE SAME

(71) Applicant: TOKYO ELECTRON LIMITED, Tokyo (JP)

(72) Inventor: Muneaki Tamura, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 146 days.

(21) Appl. No.: 16/700,432

(22) Filed: Dec. 2, 2019

(65) Prior Publication Data
US 2020/0174040 A1 Jun. 4, 2020

(30) Foreign Application Priority Data
Dec. 4, 2018 (JP) .............................. JP2018-227355

(51) Int. Cl.
| | | |
|---|---|---|
| G01R 1/04 | (2006.01) | |
| G01R 1/067 | (2006.01) | |
| G01R 1/073 | (2006.01) | |
| G01R 31/27 | (2006.01) | |
| G01R 31/26 | (2020.01) | |
| G01N 27/04 | (2006.01) | |
| G01N 27/22 | (2006.01) | |
| G01R 31/28 | (2006.01) | |

(52) U.S. Cl.
CPC ..... *G01R 1/07371* (2013.01); *G01R 31/2886* (2013.01)

(58) Field of Classification Search
CPC .......... G01R 1/04; G01R 1/067; G01R 1/073; G01R 1/07371; G01R 31/02; G01R 31/26; G01R 31/27; G01R 31/28; G01R 31/2886; G01R 31/2887; G01N 27/04; G01N 27/22
See application file for complete search history.

(56) References Cited

U.S. PATENT DOCUMENTS

| | | | |
|---|---|---|---|
| 2007/0229098 A1* | 10/2007 | Kobayashi | G01R 31/2891 324/750.23 |
| 2017/0219625 A1* | 8/2017 | Saiki | G01R 31/2891 |
| 2019/0043745 A1* | 2/2019 | Zhang | H01L 21/682 |

FOREIGN PATENT DOCUMENTS

JP 2003-270304 A 9/2003

* cited by examiner

*Primary Examiner* — Neel D Shah
(74) *Attorney, Agent, or Firm* — Nath, Goldberg & Meyer; Jerald L. Meyer; Tanya E. Harkins (57) ABSTRACT

There is provided a probe device for inspecting a wafer. The probe device includes: an upper camera provided in a wafer alignment unit; a lower camera provided in a stage; a target member provided in any one of the wafer alignment unit and the stage; and a control circuit configured to control each operation of the upper and lower camera. The target member has an end surface on which a target mark is provided, wherein any of the upper and lower camera is configured to capture an image of the target mark. The control circuit is configured to acquire a captured image of the target mark using any of the upper camera and the lower camera; and calculate a correspondence between a specific physical parameter and a value represented in the captured image for a parameter represented in the captured image among physical parameters, based on the acquired captured image.

7 Claims, 9 Drawing Sheets

PROBE DEVICE AND METHOD OF ADJUSTING THE SAME

CROSS-REFERENCE TO RELATED APPLICATION

This application is based upon and claims the benefit of priority from Japanese Patent Application No. 2018-227355, filed on Dec. 4, 2018, the entire contents of which are incorporated herein by reference.

TECHNICAL FIELD

Exemplary embodiments of the present disclosure relate to a probe device and a method of adjusting the probe device.

BACKGROUND

A probe device is used for inspection of a semiconductor wafer. A technique regarding a probe device is disclosed in, for example, Patent Document 1. In the technique disclosed in Patent Document 1, light source parts are provided at four positions each shifted, for example, by 90 degrees around an image-capturing part so as to illuminate a needle tip from four directions. Only one of the four light source parts is sequentially brought into a light-emitting state, and thus four irradiation patterns are obtained. An optimal irradiation pattern is selected on the basis of the four images of the needle tip for each irradiation pattern. The needle tip is recognized on the basis of the selected irradiation pattern. In addition, after the images for respective irradiation patterns are combined to form, for example, binarized images, a bright area common to the four binarized images may be acquired. The acquired area may be recognized as the needle tip.

PRIOR ART DOCUMENT

Patent Document

Patent Document 1: Japanese Laid-Open Patent Publication No. 2003-270304

SUMMARY

In an exemplary embodiment, a probe device is provided. The probe device is a device for inspecting a wafer. The probe device includes an upper camera, a lower camera, a target member, and a control circuit. The upper camera is provided in the wafer alignment unit. The lower camera is provided in a stage, which is disposed below the wafer alignment unit so as to place the wafer thereon. The target member is provided in any one of the wafer alignment unit and the stage. The target member has an end surface on which a target mark is provided. Any of the upper camera and the lower camera is capable of capturing an image of the target mark. The control circuit controls each operation of the upper camera and the lower camera. The control circuit acquires a captured image of the target mark using any of the upper camera and the lower camera, which is capable of capturing an image of the target member. The control circuit calculates a correspondence between a specific physical parameter and a value represented in the captured image for a parameter represented in the captured image among a plurality of physical parameters that the probe device has, based on the acquired captured image.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In an exemplary embodiment, a probe device is provided. The probe device is a device for inspecting a wafer. The probe device includes an upper camera, a lower camera, a target member, and a control circuit. The upper camera is provided in the wafer alignment unit. The lower camera is provided in a stage, which is disposed below the wafer alignment unit so as to place a wafer thereon. The target member is provided in any one of the wafer alignment unit and the stage. The target member has an end surface on which a target mark is provided. Any of the upper camera and the lower camera is able to capture an image of the target mark. The control circuit controls each operation of the upper camera and the lower camera. The control circuit acquires a captured image of the target mark using any of the upper camera and the lower camera, which is capable of capturing an image of the target member. On the basis the acquired captured image, the control circuit calculates a correspondence between a specific physical parameter and a value represented in the captured image with respect to parameters represented in the captured image among a plurality of physical parameters that the probe device has. By using the captured image of the target mark as described above, an adjustment related to the physical parameter that the probe device has and is represented in the captured image can be easily performed regardless of the inter-device difference in the probe device.

In an exemplary embodiment, the probe device further includes a lighting member. The lighting member is capable of illuminating the target mark. The control circuit calculates a correspondence between a set value of the output of the lighting member and the brightness represented in the captured image. For this reason, in the captured image acquired by the upper camera or the lower camera, the correspondence between the brightness and the output of the lighting member is acquired. Therefore, it is possible to adjust the brightness of the captured image according to the output of the lighting member such that a plurality of devices have the same conditions. Therefore, regardless an inter-device difference in the probe device, an adjustment is enabled.

In an exemplary embodiment, the probe device further includes a moving mechanism. The moving mechanism is capable of moving the stage. The control circuit sequentially moves the stage to two predetermined positions using the moving mechanism. The control circuit acquires a captured image of the target mark at each of the two positions. The control circuit calculates a correspondence between the actual dimension of the distance between the two positions and the number of pixels corresponding to the length between the respective target mark images of the two acquired captured images. For this reason, in the captured image acquired by the upper camera or the lower camera, the correspondence between the number of pixels and the actual dimension (e.g., the actual dimension corresponding to a unit pixel) is acquired. Accordingly, regardless of the inter-device difference in the probe device, it is possible to calculate the actual dimension of the part of the probe device corresponding to the image from the size of an image included in the captured image or the amount of movement of the center of gravity position of the image.

In an exemplary embodiment, the probe device further includes a moving mechanism. The moving mechanism is capable of moving the stage. The control circuit includes a first image-capturing mode and a second image-capturing mode having different image-capturing magnifications. The control circuit sequentially moves the stage to a first stage position corresponding to the first image-capturing mode and a second stage position corresponding to the second image-capturing mode using the moving mechanism. The control circuit acquires a captured image of the target mark at each of the first stage position and the second stage position. The control circuit calculates a correspondence between the first stage position and a position of the image of the target mark in the captured images acquired in the first stage position, and a correspondence between the second stage position and a position of the image of the target mark in the captured images acquired in the second stage position. Therefore, regardless of the inter-device difference in the probe device, it is possible to calculate the distance between the first stage position and the second stage position from the captured images. Regardless of the inter-device difference in the probe device, it is possible to adjust the moving distance of the stage that moves for each image-capturing mode (adjustment of the position of the stage for each image-capturing mode).

In an exemplary embodiment, the probe device further includes a moving mechanism. The moving mechanism is capable of moving the stage. The control circuit moves the stage to a scheduled scan start position for a wafer disposed on the stage using the moving mechanism, and obtains a captured image of the target mark. The control circuit calculates a difference between a reference area set in advance in the captured image and the position of the image of the target mark in the acquired captured image. The reference area is an area in which the image of the target mark is disposed in a captured image acquired when the stage is at an appropriate scan start position. For this reason, regardless of an inter-device difference in the probe device, it is possible to calculate how far the scheduled scan start position of the stage at that time is spaced apart from the appropriate scan start position (how much the scheduled start position is to be adjusted to achieve the proper start position) using a captured image. When this calculation result is used, regardless of an inter-device difference in the probe device, it is possible to suitably move the stage to the appropriate scan start position on the basis of the captured image.

In an exemplary embodiment, the probe device further includes an air blowing device. The target member is provided on the stage. The air blowing device injects air towards the target mark. Therefore, when the target member is provided on the stage, the air blowing device may inject air towards the target mark in order to remove dust from the target mark of the target member.

In an exemplary embodiment, a method for adjusting a probe device is provided. The probe device includes an upper camera, a lower camera, and a target member. The upper camera is provided in the wafer alignment unit. The lower camera is installed in a stage, which is disposed below the wafer alignment unit so as to place a wafer thereon. The target member has an end surface provided with a target mark, and is installed on either the wafer alignment unit or the stage. This method acquires a captured image of the target mark using any of the upper camera and the lower camera, each of which is capable of capturing an image of the target member. Thereafter, a correspondence between a specific physical parameter and a value represented in the captured image for a parameter represented in the captured image among a plurality of physical parameters that the probe device has is calculated on the basis of the acquired captured image. By using the captured image of the target mark, an adjustment related to the physical parameter that the probe device has and is represented in the captured image can be easily performed regardless of the inter-device difference in the probe device.

Hereinafter, various exemplary embodiments will be described in detail with reference to the accompanying drawings. In each of the drawings, the same or corresponding components will be denoted by the same reference numerals.

Figure 1:
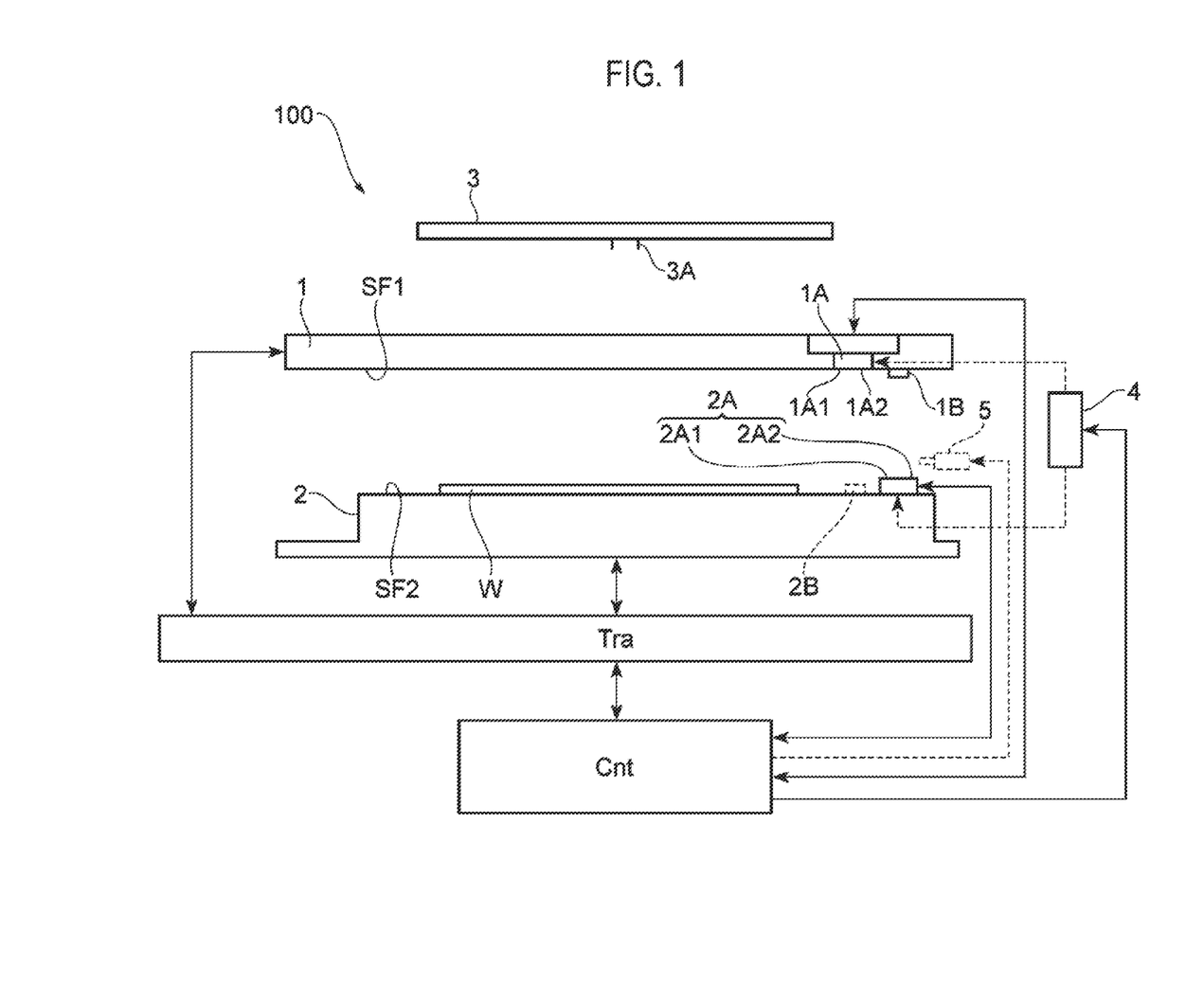
FIG. 1 is a view illustrating an example of the configuration of a probe device according to an exemplary embodiment.

An example of the configuration of a probe device 100 will be described with reference to FIG. 1. The configuration of target members (a target member 1B and a target member 2B) provided in the probe device 100 illustrated in FIG. 1 will be described with reference to FIG. 2.

The probe device 100 is a device for inspecting a wafer. The probe device 100 includes a wafer alignment unit 1, an upper camera 1A, a target member 1B, a stage 2, a lower camera 2A, a probe card 3, a probe 3A, a lighting member 4, a control circuit Cnt, and a moving mechanism Tra (such as a linear guide).

The wafer alignment unit 1 is provided with the upper camera 1A and the target member 1B. The upper camera 1A includes a first image-capturing lens 1A1 and a second image-capturing lens 1A2. The first image-capturing lens 1A1 and the second image-capturing lens 1A2 are provided on the surface SF1 of the wafer alignment unit 1. The first image-capturing lens 1A1 and the second image-capturing lens 1A2 are optically connected to the upper camera 1A and have different optical magnifications.

Each of the first image-capturing lens 1A1 and the second image-capturing lens 1A2 may be used depending on an image-capturing mode. For example, the first image-capturing lens 1A1 may be used in a high-magnification mode, and the second image-capturing lens 1A2 may be used in a low-magnification mode.

The target member 1B is provided on the surface SF1 of the wafer alignment unit 1.

The surface SF1 faces the stage 2. The first image-capturing lens 1A1, the second image-capturing lens 1A2, and the target member 1B all face the stage 2.

Figure 2:
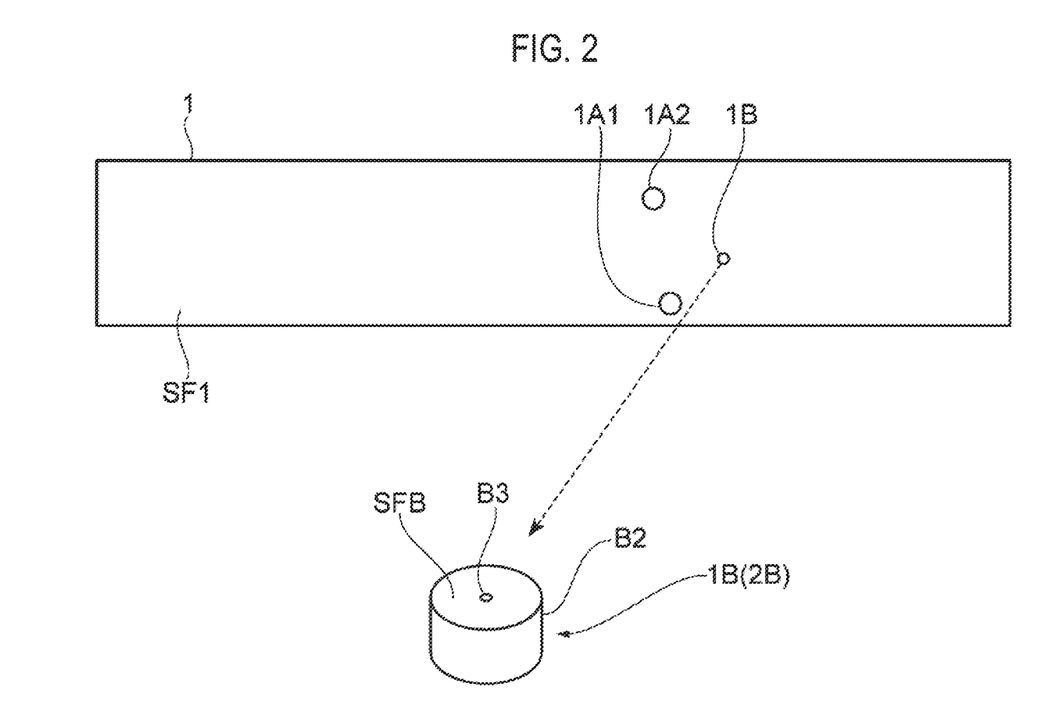
FIG. 2 is a view illustrating an example of the configuration of a target member shown in FIG. 1.

As illustrated in FIG. 2, the target member 1B includes a protrusion B2 and a target mark B3. In an embodiment, the target member 1B may be fixed to the surface SF1 of the wafer alignment unit 1.

The protrusion B2 has, for example, a substantially cylindrical shape.

The end surface SFB of the protrusion B2 has a substantially circular shape. The end surface SFB faces the stage 2. The end surface SFB is coated. Thanks to the coating of the end surface SFB, when the control circuit Cnt acquires a captured image of the target member 1B under illumination by the lighting member 4, the gradation of brightness of the captured image is not saturated within a predetermined range of the output of the lighting member 4. It is also possible to adjust the gradation of brightness of the captured image so as not to be saturated by adjusting the sensitivity of the camera instead of coating the end surface SFB.

A target mark B3 is provided on the end surface SFB. The target mark B3 is provided, for example, in the center of the end surface SFB. In an embodiment, the target mark B3 may be a pinhole. The lower camera 2A may capture an image of the target mark B3 included in the target member 1B.

Descriptions will be made to FIG. 1. The stage 2 is disposed below the wafer alignment unit 1. A wafer W may be placed on the surface SF2 of the stage 2. The surface SF2 of the stage 2 faces the surface SF1 of the wafer alignment unit 1.

The lower camera 2A is provided in the stage 2. The lower camera 2A may capture an image of the target member 1B. The lower camera 2A includes a first image-capturing lens 2A1 and a second image-capturing lens 2A2. The first image-capturing lens 2A1 and the second image-capturing lens 2A2 are provided in the stage 2. The first image-capturing lens 2A1 and the second image-capturing lens 2A2 are optically connected to the lower camera 2A and have different optical magnifications. Each of the first image-capturing lens 2A1 and the second image-capturing lens 2A2 may be used depending on an image-capturing mode. For example, the first image-capturing lens 2A1 may be used in a high-magnification mode, and the second image-capturing lens 2A2 may be used in a low-magnification mode.

A target member 2B may be installed in the stage 2. The target member 2B may have the same configuration and function as the target member 1B.

When the target member 2B is provided on the stage 2, the upper camera 1A may be able to capture the target mark B3 included in the target member 2B. The probe device 100 may have a configuration obtained by replacing the lower camera 2A and the target member 1B in the following description with the upper camera 1A and the target member 2B, respectively.

When the target member 2B is provided on the stage 2, the probe device 100 may include an air-blowing device 5. The air blowing device 5 injects air towards the target mark B3 of the target member 2B in order to remove dust from the target mark B3 of the target member 2B.

The lighting member 4 may illuminate a wafer W placed on the stage 2, a plurality of probes 3A, and the target mark B3 using a plurality of lights (not illustrated) provided in the probe device 100. The plurality of lights provided in the probe device 100 are provided, for example, near the high-magnification lens (e.g., the first image-capturing lens 1A1) and the low-magnification lens (e.g., the second image-capturing lens 1A2) of the upper camera 1A, respectively. In addition, the plurality of lights provided in the probe device 100 are provided, for example, near the high-magnification lens (e.g., the first image-capturing lens 2A1) and the low-magnification lens (e.g., the second image-capturing lens 2A2) of the lower camera 2A, respectively. The lighting member 4 may perform flash irradiation via a light provided in the upper camera 1A in synchronization with the timing of image-capturing performed by the upper camera 1A when scanning is performed on the wafer W.

The moving mechanism Tra may move the wafer alignment unit 1, the stage 2, and the like. In particular, the moving mechanism Tra may move the stage 2 in the X, Y, Z. and $\theta$ directions, particularly, in a prober chamber.

The probe card 3 includes a plurality of probes 3A. The plurality of probes 3A are provided so as to be in contact with a plurality of electrode pads of the wafer W placed on the stage 2.

The control circuit Cnt includes a CPU and memory such as ROM or RAM. When the CPU executes various computer programs stored in the memory, the control circuit Cnt collectively controls the operation of each part (e.g., the upper camera 1A, the lower camera 2A, the moving mechanism Tra, or the lighting member 4) of the probe device 100.

Figure 3:
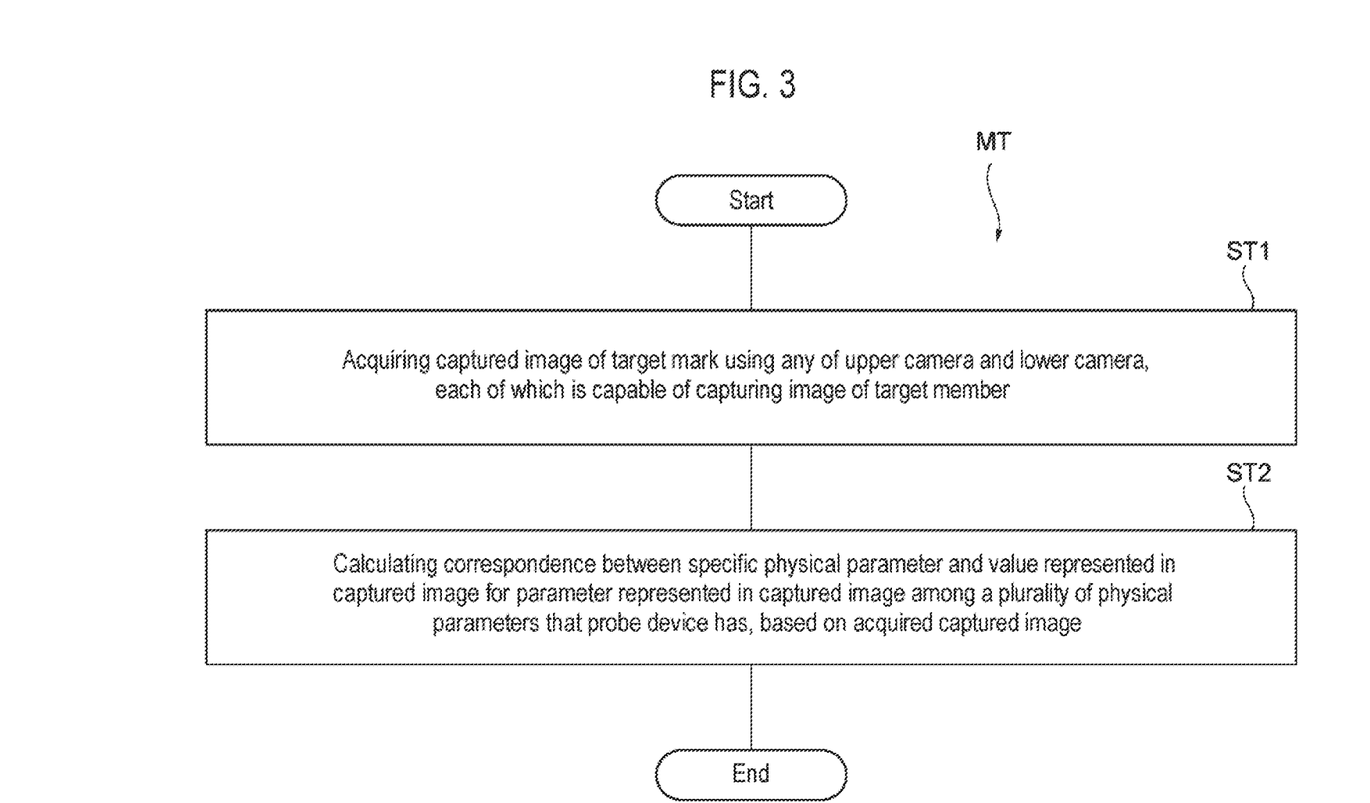
FIG. 3 is a flowchart illustrating an example of a method of adjusting a probe device according to an exemplary embodiment.

The control circuit Cnt executes a method MT illustrated in the flowchart of FIG. 3. The control circuit Cnt executes at least one of, for example, methods MT1 to MT4 illustrated in each of FIGS. 4 to 7 as the method MT. The methods MT1 to MT4 illustrated in each of FIGS. 4 to 7 are specific examples of the method MT.

After executing the method MT, the control circuit Cnt performs an alignment with respect to the plurality of electrode pads of the wafer W and the plurality of probes 3A (alignment between the stage 2 and the probe card 3). This alignment is performed using the stage 2, the moving mechanism Tra, the lower camera 2A, the upper camera 1A, and the like. The wafer W is index-fed by the stage 2 after this alignment. After the index feeding, an electrical characteristic inspection of each device provided on the wafer W is performed.

According to the probe device 100 having the above-described configuration, the adjustment of the physical parameters that the probe device 100 has and are represented in the captured image may be easily performed using the captured image of the target mark B3, regardless of an inter-device difference in the probe device 100.

The physical parameters may be the output of the lighting member 4 (method MT1) and the pixel size of the captured image (method MT2). The physical parameters may further include a distance (method MT3) by which the stage 2 actually moves between the position of the stage 2 corresponding to the high-magnification mode and the position of the stage 2 corresponding to the low-magnification mode. The physical parameters may further include the position of the stage 2 disposed at the start of scanning of the wafer W (an appropriate start position) (method MT4).

As illustrated in FIG. 3, the control circuit Cnt executes the method MT. The method MT includes steps ST1 and ST2. In step ST1, the control circuit Cnt acquires a captured image of the target mark B3 using any of the upper camera 1A and the lower camera 2A, which are capable of capturing an image of the target member 2B or 1B.

In step ST2 subsequent to step ST1, the control circuit Cnt executes the following processing. That is, on the basis of the acquired captured image, the control circuit Cnt calculates a correspondence between a physical parameter described above and a value represented in the captured image with respect to parameters represented in the captured image among a plurality of physical parameters that the probe device 100 has.

Figure 4:
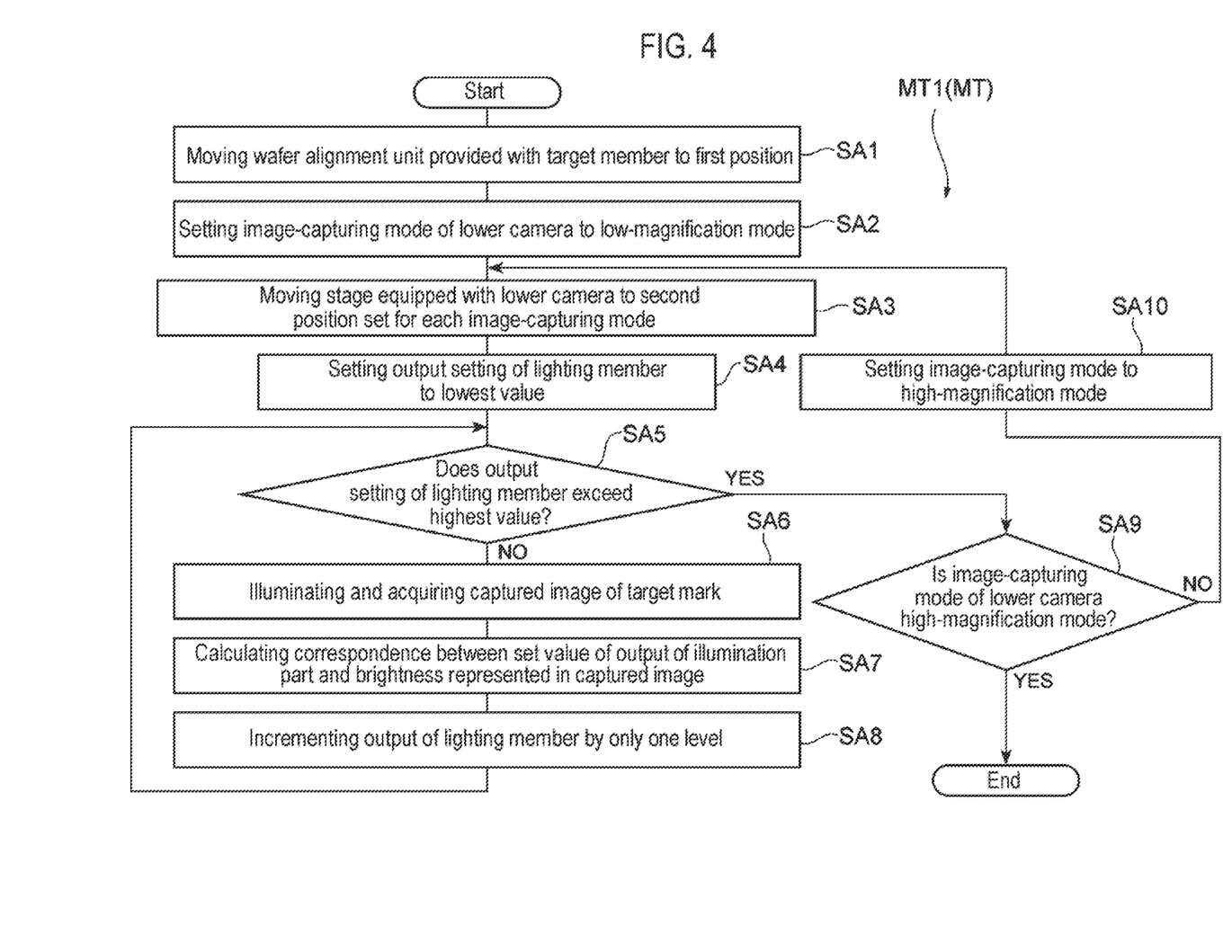
FIG. 4 is a flowchart illustrating a specific example of the adjustment method illustrated in FIG. 3.

The control circuit Cnt may execute the method MT1 illustrated in the flowchart of FIG. 4 as the method MT. The method MT1 includes steps SA1 to SA10.

In the method MT1, the control circuit Cnt calculates a correspondence between a set value of the output of the lighting member 4 and the brightness represented in the captured image.

The method MT1 will be described in more detail with reference to FIG. 4. In step SA1, the control circuit Cnt moves the wafer alignment unit 1 on which the target member 1B is installed to a first position. The first position is a predetermined position at which the wafer alignment unit 1 may be disposed when the method MT is executed (which is applicable to the following description). In step SA2 subsequent to step SA1, the control circuit Cnt sets the image-capturing mode of the lower camera 2A to the low-magnification mode.

In step SA3 subsequent to step SA2, the control circuit Cnt moves the stage 2 to a second position set for each image-capturing mode of the lower camera 2A using the moving mechanism Tra. The second position includes a position corresponding to the high-magnification mode and a position corresponding to the low-magnification mode (which is applicable to the following description).

In step SA4 subsequent to step SA3, the control circuit Cnt sets the output setting of the lighting member 4 to the predetermined lowest value. The output of the lighting member 4 may be adjusted to a plurality of levels including the first to N-th levels (N is an integer). When the output of the lighting member 4 is at the first level, the output of the lighting member 4 corresponds to the lowest value. When the output of the lighting member 4 is the N-th level, the output of the lighting member 4 corresponds to the highest value. The output ranges of the first to N-th levels are set in advance such that the brightness of a captured image is not saturated. In step SA5 subsequent to step SA4, the control circuit Cnt determines whether the output setting of the lighting member 4 exceeds the predetermined highest value.

When it is determined in step SA5 that the output setting of the lighting member 4 does not exceed the highest value (step SA5: "NO"), the control circuit Cnt proceeds to step SA6. In step SA6, the control circuit Cnt acquires a captured image of the target mark B3 using the lower camera 2A while illuminating the target mark B3 using the lighting member 4.

In step SA7 subsequent to step SA6, the control circuit Cnt calculates a correspondence between a set value of the output of the lighting member 4 and the brightness represented in the captured image. In step SA8 subsequent to step SA7, the control circuit Cnt increments the output of the lighting member 4 by only one level, and proceeds to step SA5. Steps SA5 to SA8 are repeated until the output of the lighting member 4 reaches the N-th level. In a case in which the resolution is allowed as acquired data, the output of the lighting member 4 is not incremented by one level, but may be incremented by a plurality of levels (e.g., five levels) at a time.

When it is determined in step SA5 that the output setting of the lighting member 4 exceeds the highest value (step SA5: "YES"), the control circuit Cnt proceeds to step SA9. In step SA9, the control circuit Cnt determines whether or not the image-capturing mode of the lower camera 2A is the high-magnification mode.

When it is determined in step SA9 that the image-capturing mode of the lower camera 2A is the high-magnification mode (step SA9: "YES"), the control circuit Cnt terminates the execution of the method MT1. When it is determined that the image-capturing mode of the upper camera 1A is not the high-magnification mode (step SA9: "NO"), the control circuit Cnt proceeds to step SA10. In step SA10, the control circuit Cnt sets the image-capturing mode of the lower camera 2A to the high-magnification mode, proceeds to step SA3, and repeats each processing subsequent to step SA3.

By the method MT1, for each of the high-magnification mode and the low-magnification mode of the lower camera 2A, in the range from the predetermined lowest value to the predetermined highest value of the output of the lighting member 4, the correspondence between the set value of the output (physical parameter) of the lighting member 4 and the brightness represented in the captured image is calculated. Examples of calculation results are represented by the lines GA2 and GA3 in FIG. 8 and the lines GA2 and GA3 in FIG. 9. Examples of the correspondence between the set value of the output of the lighting member 4 and the brightness represented in the captured image, within the range from the lowest value to the highest value of the output of the lighting member 4 are represented by the lines GA2 and GA3 in FIG. 8. The results represented by the lines GA2 and GA3 are examples of results obtained using target member 1B (and target member 2B). In each of FIGS. 8 and 9, the horizontal axis represents the set value of the output of the lighting member 4, and the vertical axis represents the brightness represented in a captured image.

Figure 8:
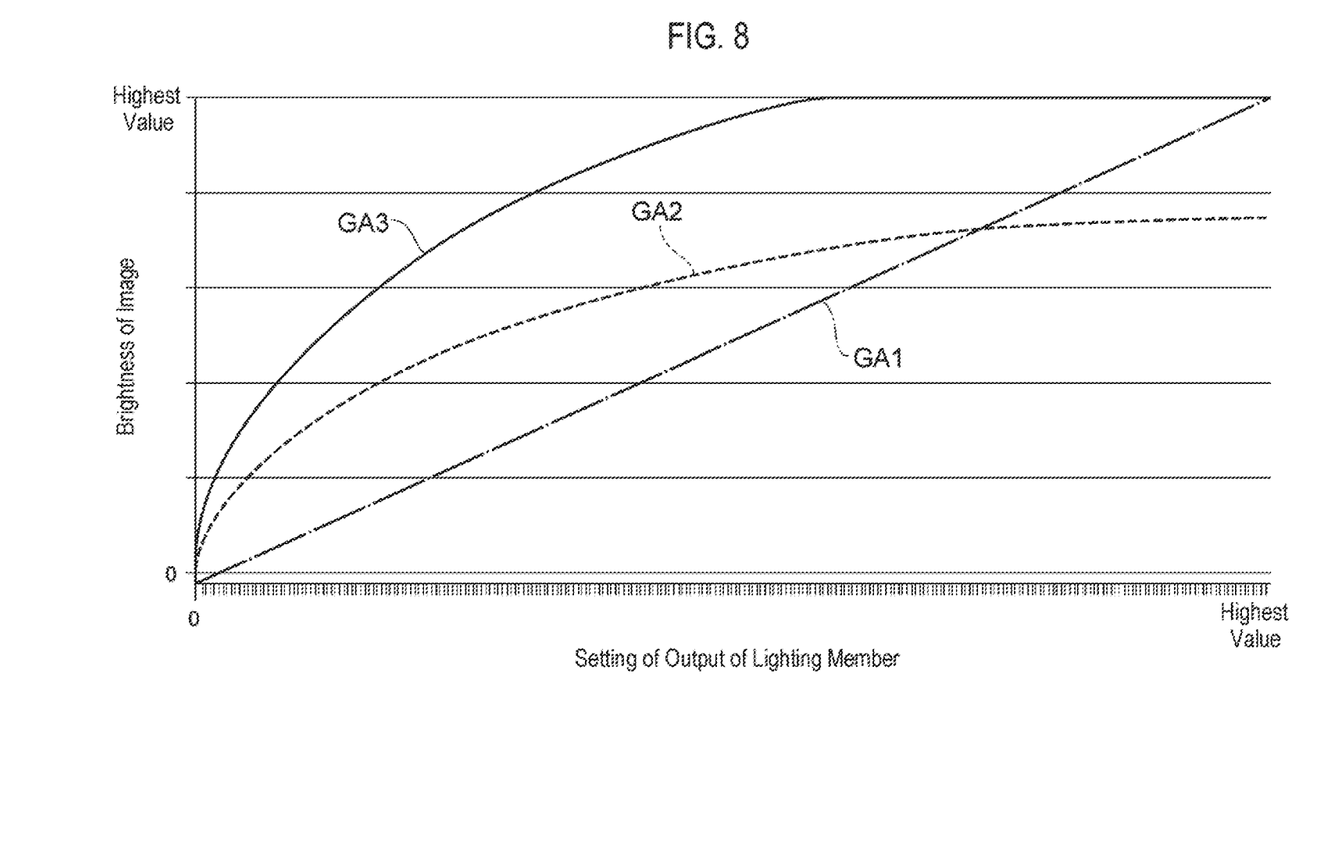
FIG. 8 is a view for explaining an example of the effect of the probe device adjustment method illustrated in FIG. 4.
Figure 9:
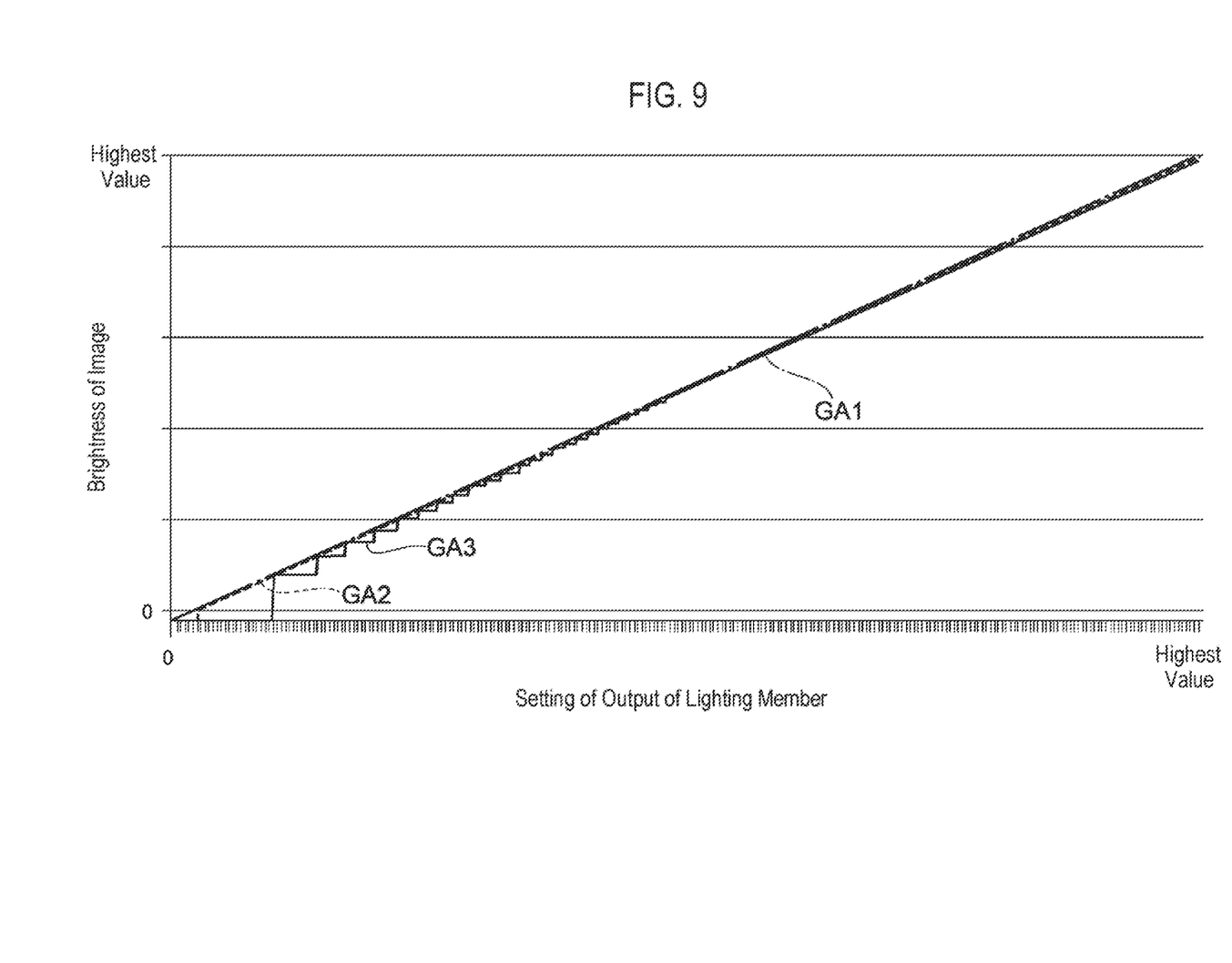
FIG. 9 is a view for explaining an example of the effect of the probe device adjustment method illustrated in FIG. 4.

The control circuit Cnt adjusts the brightness of the captured image, and the adjustment of the brightness of the captured image may be performed such that the correspondence between the set value of the output of the lighting member 4 and the brightness represented in the captured image becomes uniform (to be proportional) as represented by the line GA1 in FIGS. 8 and 9.

When the method MT1 is used, the correspondence between the brightness and the output of the lighting member 4 is acquired in the captured image acquired by the lower camera 2A. When this correspondence obtained through the method MT1 is used, it is possible to perform the adjustment of the brightness of the captured image according to the output of the lighting member 4 such that a plurality of devices have the same conditions. Therefore, it is possible to perform the adjustment regardless of an inter-device difference in the probe device 100.

Figure 5:
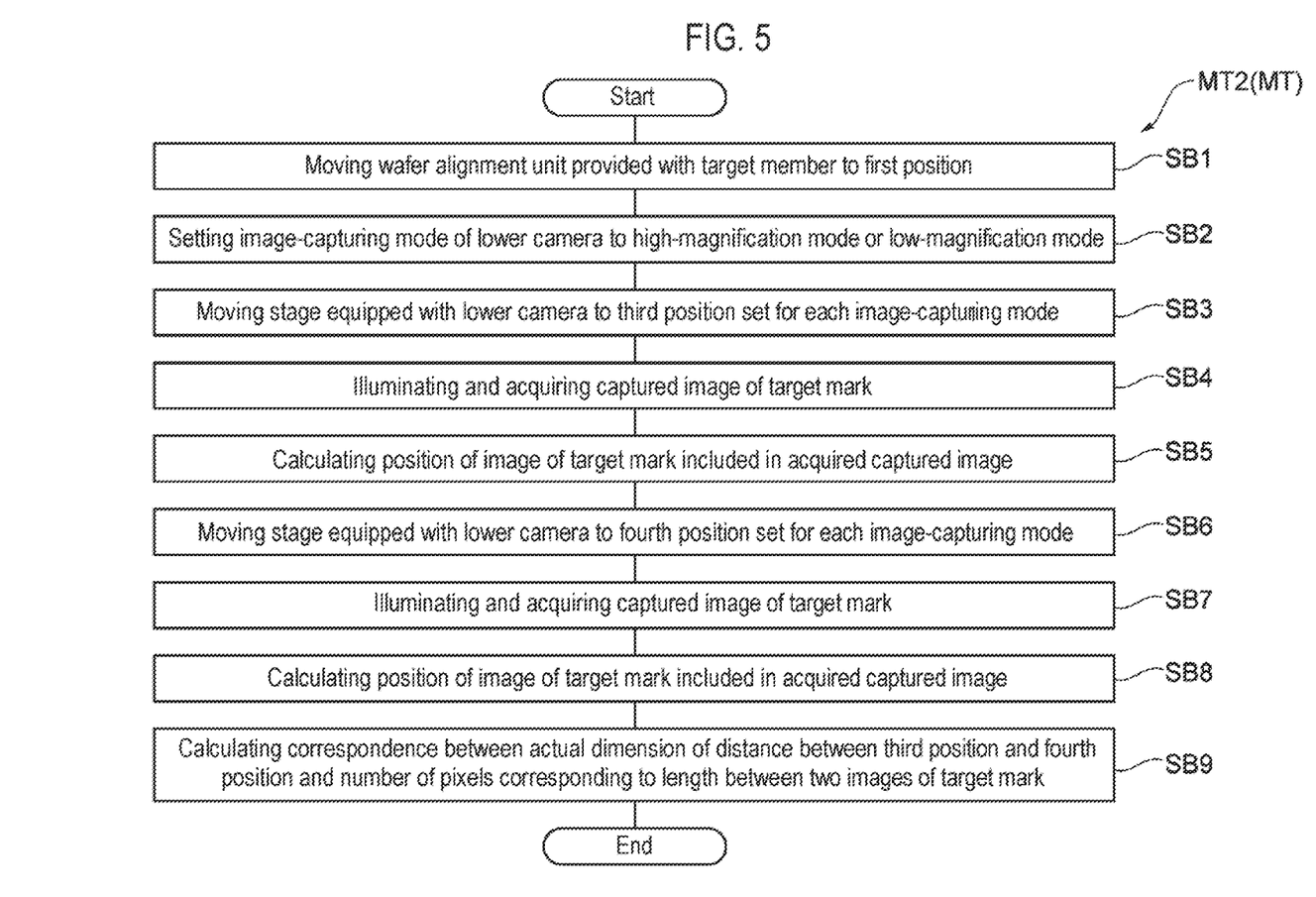
FIG. 5 is a flowchart illustrating a specific example of the adjustment method illustrated in FIG. 3.

The control circuit Cnt may execute the method MT2 illustrated in the flowchart of FIG. 5 as an exemplary method MT. The method MT2 includes steps SB1 to SB9.

In the method MT2, the control circuit Cnt sequentially moves the stage 2 to two predetermined positions using the moving mechanism Tra, and acquires a captured image of the target mark B3 at each of the two positions. The control circuit Cnt calculates a correspondence between the actual distance of the two positions and the number of pixels corresponding to the length between the images of the target marks B3 of the two acquired captured images (the length between the centers or the centers of gravity of the two target marks B3).

The method MT2 will be described in more detail with reference to FIG. 5. In step SB1, the control circuit Cnt moves the wafer alignment unit 1, on which the target member 1B is installed, to the first position using the moving mechanism Tra.

In step SB2 subsequent to step SB1, the control circuit Cnt sets the image-capturing mode of the lower camera 2A to the high-magnification mode or the low-magnification mode. In step SB3 subsequent to step SB2, the control circuit Cnt moves the stage 2 to a third position set for each image-capturing mode of the lower camera 2A using the moving mechanism Tra. The third position may be the position of the stage 2 that causes the image of the target mark B3 to be disposed at the upper left in the captured image of the target mark B3. The third position includes a position corresponding to the high-magnification mode and a position corresponding to the low-magnification mode.

In step SB4 subsequent to step SB3, the control circuit Cnt acquires a captured image of the target mark B3 using the lower camera 2A while illuminating the target mark B3 using the lighting member 4 in a state in which the stage 2 is located at the third position. In step SB5 subsequent to step SB4, the control circuit Cnt calculates the position of the image of the target mark B3 included in the captured image acquired in the state in which the stage 2 is located at the third position.

In step SB6 subsequent to step SB5, the control circuit Cnt moves the stage 2 to a fourth position set for each image-capturing mode of the lower camera 2A using the moving mechanism Tra.

The fourth position may be the position of the stage 2 that causes, for example, the image of the target mark B3 to be disposed at the lower right in the captured image of the target mark B3. The fourth position includes a position corresponding to the high-magnification mode and a position corresponding to the low-magnification mode.

In step SB7 subsequent to step SB6, the control circuit Cnt acquires a captured image of the target mark B3 using the lower camera 2A while illuminating the target mark B3 using the lighting member 4 in a state in which the stage 2 is located at the fourth position. In step SB8 subsequent to step SB7, the control circuit Cnt calculates the position of the image of the target mark B3 included in the captured image acquired in the state in which the stage 2 is located at the fourth position.

In step SB9 subsequent to step SB8, a correspondence between the actual dimension (physical parameter) of the distance between the third position and the fourth position and the number of pixels corresponding to the length between the positions of the two images of the target mark B3 calculated in steps SB5 and SB8 is calculated. Data indicating the actual dimension of the distance between the third position and the fourth position is stored in advance in memory such as the ROM of the control circuit Cnt.

When using the method MT2, in the captured image acquired by the lower camera 2A, the correspondence between the number of pixels and the actual dimension (e.g., the actual dimension corresponding to a unit pixel) is acquired. When using the correspondence acquired through the method MT2, regardless of the inter-device difference in the probe device 100, it is possible to calculate the actual dimension of the part of the probe device corresponding to the image from the size of an image included in the captured image or the amount of movement of the center of gravity position of the image.

Figure 6:
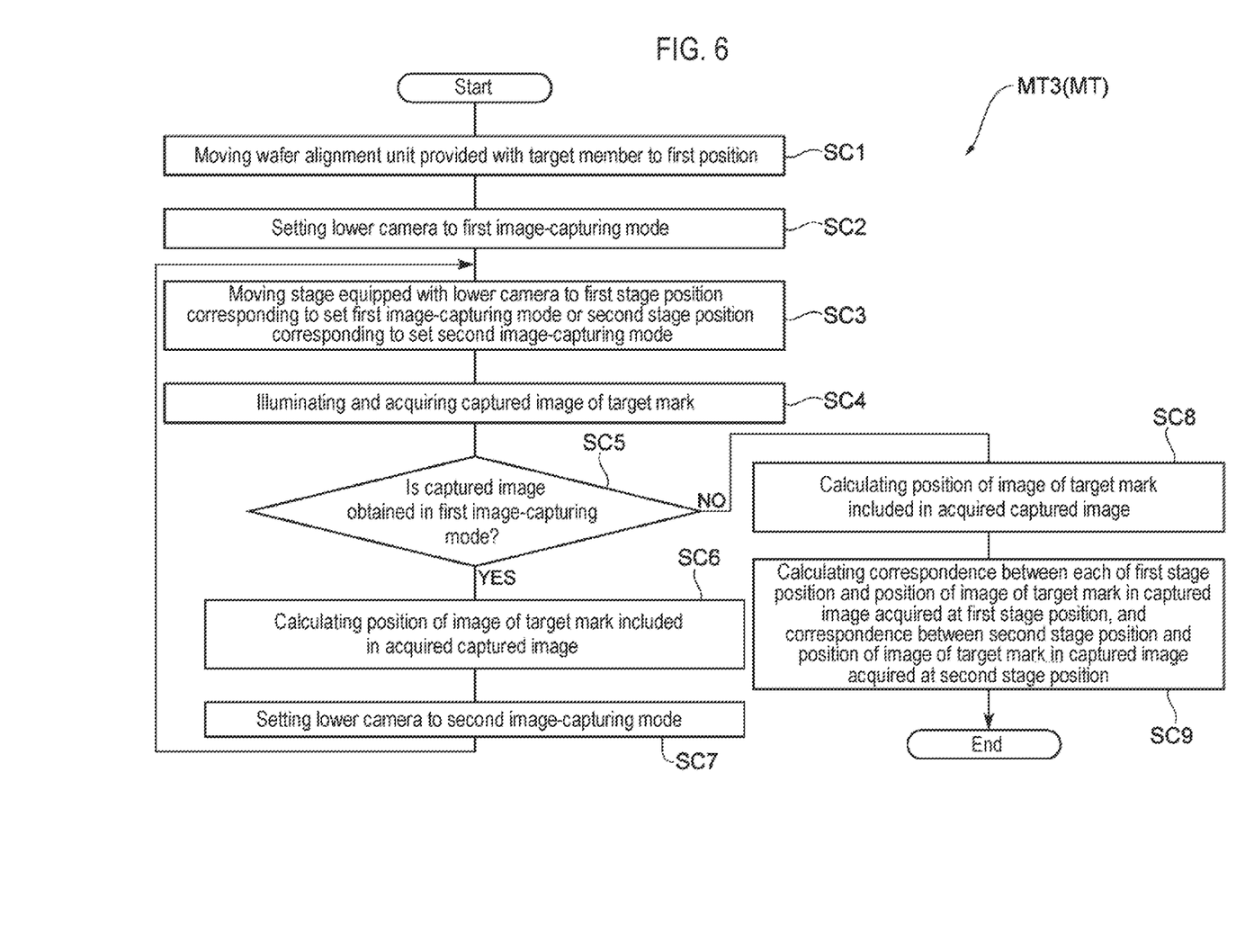
FIG. 6 is a flowchart illustrating a specific example of the adjustment method illustrated in FIG. 3.

The control circuit Cnt may execute the method MT3 illustrated in the flowchart of FIG. 6 as the method MT. The method MT3 includes steps SC1 to SC9.

In the method MT3, the control circuit Cnt includes a first image-capturing mode and a second image-capturing mode of the lower camera 2A having different image-capturing magnifications. The first image-capturing mode is one of the high-magnification mode and the low-magnification mode of the lower camera 2A (e.g., the high-magnification mode). The second image-capturing mode is remaining the other of the high-magnification mode and the low-magnification mode of the lower camera 2A (e.g., the low-magnification mode).

The control circuit Cnt sequentially moves the stage 2 to a first stage position corresponding to the first image-capturing mode and a second stage position corresponding to the second image-capturing mode using the moving mechanism Tra. The control circuit Cnt acquires a captured image of the target mark B3 at each of the first stage position and the second stage position. The control circuit calculates a correspondence between each of the first stage position and the second stage position and the position of the image of the target mark B3 in each of the two acquired captured images.

The method MT3 will be described in more detail with reference to FIG. 6. In step SC1, the control circuit Cnt moves the wafer alignment unit 1, on which the target member 1B is installed, to the first position using the moving mechanism Tra.

In step SC2 subsequent to step SC1, the control circuit Cnt sets the image-capturing mode of the lower camera 2A to the first image-capturing mode. In step SC3 subsequent to step SC2, the control circuit Cnt moves the stage 2 to the first stage position corresponding to the set first image-capturing mode or the second stage position corresponding to the set second image-capturing mode, using the moving mechanism Tra.

In step SC4 subsequent to step SC3, the control circuit Cnt acquires a captured image of the target mark B3 using the lower camera 2A while illuminating the target mark B3 using the lighting member 4. In step SC5 subsequent to step SC4, the control circuit Cnt determines whether or not the captured image was acquired in the first image-capturing mode in step SC4.

In step SC5, when it is determined that the captured image was acquired in the first image-capturing mode (step SC5: "YES"), the control circuit Cnt proceeds to step SC6. In step SC6, the control circuit Cnt calculates the position of the target mark B3 (the center or the center of gravity of the image, which is applicable to the following description) included in the captured image acquired in step SC4 in the state in which the position of the stage 2 is located at the first stage position corresponding to the first image-capturing mode.

In step SC7 subsequent to step SC6, the control circuit Cnt sets the image-capturing mode of the lower camera 2A to the second image-capturing mode, and proceeds to step SC3.

In step SC5, when it is determined that the captured image was not acquired in the first image-capturing mode (that is, acquired in the second image-capturing mode) (step SC5: "NO"), the control circuit Cnt proceeds to step SC8. In step SC8, the control circuit Cnt calculates the position of the target mark B3 included in the captured image acquired in step SC4 in the state in which the position of the stage 2 is located at the second stage position corresponding to the second image-capturing mode.

In step SC9 subsequent to step SC8, the control circuit Cnt calculates a correspondence between the first stage position and the position of the image of the target mark B3 in the captured image acquired at the first stage position, and a correspondence between the second stage position and the position of the image of the target mark B3 in the captured image acquired at the second stage position.

When the method MT3 is used, the correspondence between the moving distance (physical parameter) of the stage 2 that moves for each image-capturing mode of the lower camera 2A and the number of pixels represented in the captured image corresponding to the moving distance is acquired. When the correspondence obtained through the method MT3 is used, it is possible to calculate the distance between the first stage position and the second stage position from the captured image regardless of the inter-device difference in the probe device 100. Accordingly, regardless of the inter-device difference in the probe device 100, it is possible to perform the adjustment of the moving distance of the stage 2 that moves for each image-capturing mode of the lower camera 2A (the adjustment of the position of the stage 2 for each image-capturing mode).

Figure 7:
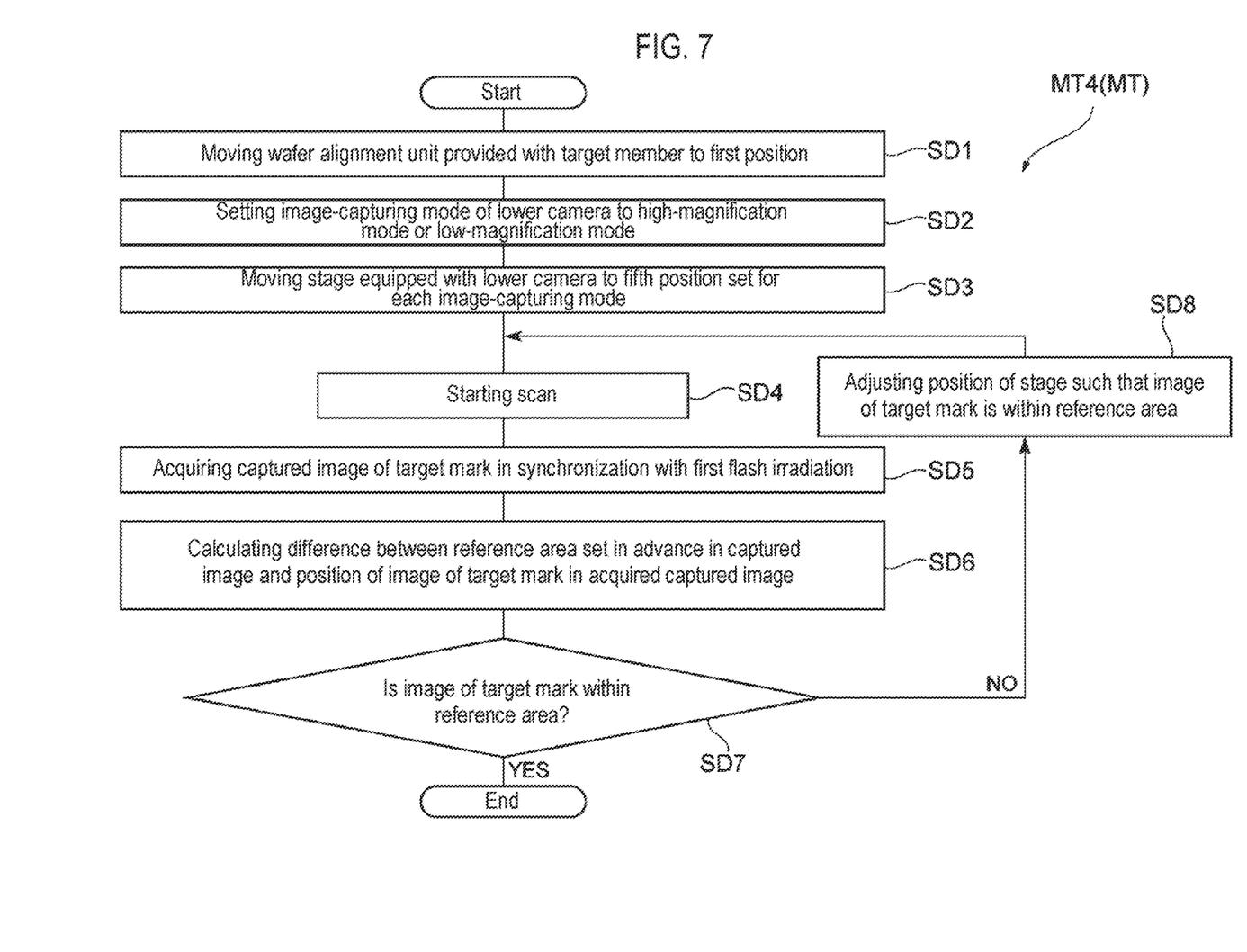
FIG. 7 is a flowchart illustrating a specific example of the adjustment method illustrated in FIG. 3.

The control circuit Cnt may execute the method MT4 illustrated in the flowchart of FIG. 7 as the method MT. The method MT4 includes steps SD1 to SD8.

In the method MT4, the control circuit Cnt moves the stage 2 to a scheduled scan start position for the wafer W on the stage 2 using the moving mechanism Tra, and acquires the captured image of the target mark B3. The control circuit Cnt calculates a difference between a reference area set in advance in the captured image and the position of the image of the target mark B3 in the acquired captured image. The reference area is an area in which the image of the target mark B is disposed in a captured image acquired when the stage 2 is at an appropriate scan start position.

The method MT4 will be described in more detail with reference to FIG. 7. In step SD1, the control circuit Cnt moves the wafer alignment unit 1, on which the target member 1B is installed, to the first position using the moving mechanism Tra.

In step SD2 subsequent to step SD1, the control circuit Cnt sets the image-capturing mode of the lower camera 2A to the high-magnification mode or the low-magnification mode. In step SD3 subsequent to step SD2, the control circuit Cnt moves the stage 2 to a fifth position set for each image-capturing mode of the lower camera 2A using the moving mechanism Tra.

The fifth position is a position corresponding to a position at which the stage 2 is disposed at the start of scanning of the wafer W (appropriate start position), and is a position at which the stage 2 actually moves in response to the start of scanning (scheduled start position). The fifth position, which is the scheduled start position, is any of an appropriate start position at which the stage 2 is disposed at the start of scanning and a position that is near the start position but is different from the start position.

The fifth position, which is the scheduled scan start portion, includes a position corresponding to the high-magnification mode and a position corresponding to the low-magnification mode. The appropriate scan start position also includes a position corresponding to the high-magnification mode and a position corresponding to the low-magnification mode.

In step SD4 subsequent to step SD3, the control circuit Cnt starts the scanning of the wafer W. In step SD5 subsequent to step SD4, the control circuit Cnt acquires a captured image of the target mark B3 in synchronization with the first flash irradiation by the lighting member 4.

In step SD6 subsequent to step SD5, the control circuit Cnt calculates a difference (correspondence) between a reference area predetermined in the captured image and the position of the image of the target mark B3 in the captured image, and proceeds to step SD7. In step SD7, the control circuit Cnt determines whether or not the image of the target mark B3 is in the reference area in the captured image.

When it is determined in step SD7 that the image of the target mark B3 is in the reference area (step SD7: "YES"), the control circuit Cnt terminates the method MT4. When it is determined in step SD7 that the image of the target mark B3 is not in the reference area (step SD7: "NO"), the control circuit Cnt proceeds to step SD8.

In step SD8, the control circuit Cnt adjusts the position of the stage 2 (which is located at the scheduled start position at this time) such that the image of the target mark B3 is within the reference area (physical parameter) in the captured image, and proceeds to step SD4.

According to the method MT4, regardless of an inter-device difference in the probe device 100, it is possible to calculate how far the scheduled scan start position of the stage 2 at that time is spaced apart from the appropriate scan start position (how much the scheduled start position is to be adjusted to achieve the proper start position) using a captured image. When this calculation result is used, regardless of an inter-device difference in the probe device 100, it is possible to suitably move the stage 2 to the appropriate scan start position on the basis of the captured image.

Although various exemplary embodiments have been described above, the present disclosure is not limited to the exemplary embodiments described above, and various omissions, substitutions, and changes may be made. Also, elements in different exemplary embodiments may be combined to form other exemplary embodiments. For example, in the exemplary embodiments, the wafer alignment unit 1 is movable, but the present disclosure is not limited thereto. In the present disclosure, a component, which is provided with the upper camera and faces the stage 2 from above the stage 2, should be understood as the wafer alignment unit.

From the foregoing, it should be understood that various exemplary embodiments of the present disclosure have been described herein for purposes of illustration, and that various modifications can be made without departing from the scope and spirit of the present disclosure. Accordingly, the various exemplary embodiments disclosed herein are not intended to be limiting, and the true scope and spirit are indicated by the appended claims.

According to an exemplary embodiment, it is possible to provide a technique for reducing an inter-device difference in a probe device.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A probe device for inspecting a wafer, the probe device comprising:
- an upper camera provided in a wafer alignment unit;
- a lower camera provided in a stage, which is disposed below the wafer alignment unit so as to place the wafer thereon;
- a moving mechanism configured to move the stage;
- a target member provided in any one of the wafer alignment unit and the stage; and
- a control circuit configured to control each operation of the upper camera and the lower camera,
- wherein the target member has an end surface on which a target mark is provided,
- wherein any of the upper camera and the lower camera is configured to capture an image of the target mark,
- wherein the control circuit is configured to acquire a captured image of the target mark using any of the upper camera and the lower camera, which is capable of capturing an image of the target member; and calculate a correspondence between a specific physical parameter and a value represented in the captured image for a parameter represented in the captured image among a plurality of physical parameters that the probe device has, based on the acquired captured image, and
- wherein the control circuit is further configured to sequentially move the stage to two predetermined positions using the moving mechanism; acquire a captured image of the target mark at each of the two predetermined positions; and calculate a correspondence between an actual dimension of a distance between the two predetermined positions and a number of pixels corresponding to a length between respective images of the target mark in the two acquired captured images.

2. The probe device of claim 1, further comprising a lighting member configured to illuminate the target mark,
- wherein the control circuit is configured to calculate a correspondence between a set value of an output of the lighting member and brightness represented in the captured image.

3. The probe device of claim 1,
- wherein the control circuit comprises a first image-capturing mode and a second image-capturing mode having different magnifications, and
- wherein the control circuit is configured to sequentially move the stage to a first stage position corresponding to the first image-capturing mode and a second stage position corresponding to the second image-capturing mode using the moving mechanism; acquire a captured image of the target mark at each of the first stage position and the second stage position; and calculate a correspondence between the first stage position and a position of an image of the target mark in the captured image acquired in the first stage position, and a correspondence between the second stage position and a position of an image of the target mark in the captured images acquired in the second stage position.

4. The probe device of claim 1,
- wherein the control circuit is configured to move the stage to a scheduled scan start position for the wafer on the stage using the moving mechanism so as to acquire a captured image of the target mark; and calculate a difference between a reference area set in advance in the captured image and a position of an image of the target mark in the acquired captured image, and
- wherein the reference area is an area in which the image of the target mark is disposed in the captured image acquired when the stage is located at an appropriate scan start position.

5. The probe device of claim 1, further comprising an air blowing device,
- wherein the target member is provided on the stage, and
- wherein the air blowing device injects air towards the target mark.

6. The probe device of claim 1, further comprising an air blowing device,
- wherein the target member is provided on the stage, and
- wherein the air blowing device injects air towards the target mark.

7. A method of adjusting a probe device for inspecting a wafer, wherein the probe device includes an upper camera, a lower camera, a moving mechanism and a target member, the upper camera is installed in a wafer alignment unit, the lower camera is installed in a stage located below the wafer alignment unit to place a wafer thereon, the moving mechanism is configured to move the stage, and the target member includes an end surface having a target mark provided thereon and is provided on any of the wafer alignment unit and the stage, the method comprising:
- acquiring a captured image of the target mark using any of the upper camera and the lower camera, each of which is capable of capturing an image of the target member;
- calculating a correspondence between a specific physical parameter and a value represented in the captured image for a parameter represented in the captured image among a plurality of physical parameters that the probe device has, based on the acquired captured image;
- sequentially moving the stage to two predetermined positions using the moving mechanism;
- acquiring a captured image of the target mark at each of the two predetermined positions; and
- calculating a correspondence between an actual dimension of a distance between the two predetermined positions and a number of pixels corresponding to a length between respective images of the target mark in the two acquired captured image.

* * * * *